United States Patent [19]

Dery

[11] Patent Number: 5,030,109
[45] Date of Patent: Jul. 9, 1991

[54] AREA ARRAY CONNECTOR FOR SUBSTRATES

[75] Inventor: Ronald A. Dery, Winston-Salme, N.C.

[73] Assignee: AMP Incorporated, Harrisburg, Pa.

[21] Appl. No.: 573,427

[22] Filed: Aug. 24, 1990

[51] Int. Cl.$^5$ ............................................. H01R 9/09
[52] U.S. Cl. ...................................... 439/66; 439/840; 439/841
[58] Field of Search ................... 439/66, 74, 245, 247, 439/817, 840, 886, 887

[56] References Cited

U.S. PATENT DOCUMENTS

| | | | |
|---|---|---|---|
| 2,153,177 | 4/1939 | Ecker | 439/841 |
| 3,513,434 | 5/1970 | Zielke | 439/840 |
| 4,029,375 | 6/1977 | Gabrielian | 439/66 |
| 4,810,213 | 3/1989 | Chabot | 439/840 |
| 4,820,376 | 4/1989 | Lambert et al. | 439/66 |
| 4,838,815 | 6/1989 | Tajuma et al. | 439/840 |

Primary Examiner—Paula A. Bradley
Attorney, Agent, or Firm—Allan B. Osborne

[57] ABSTRACT

An area array connector (10) for electrically interconnecting circuit pads (18,20) on spaced apart, substrates (22,24) is disclosed. The connector (10) includes a carrier plate (12) having canted coil spring contacts (16) positioned in openings (14) for electrically interconnecting corresponding circuit pads (18,20) on the respective substrates (22,24) between which the connector (10) is placed.

7 Claims, 1 Drawing Sheet

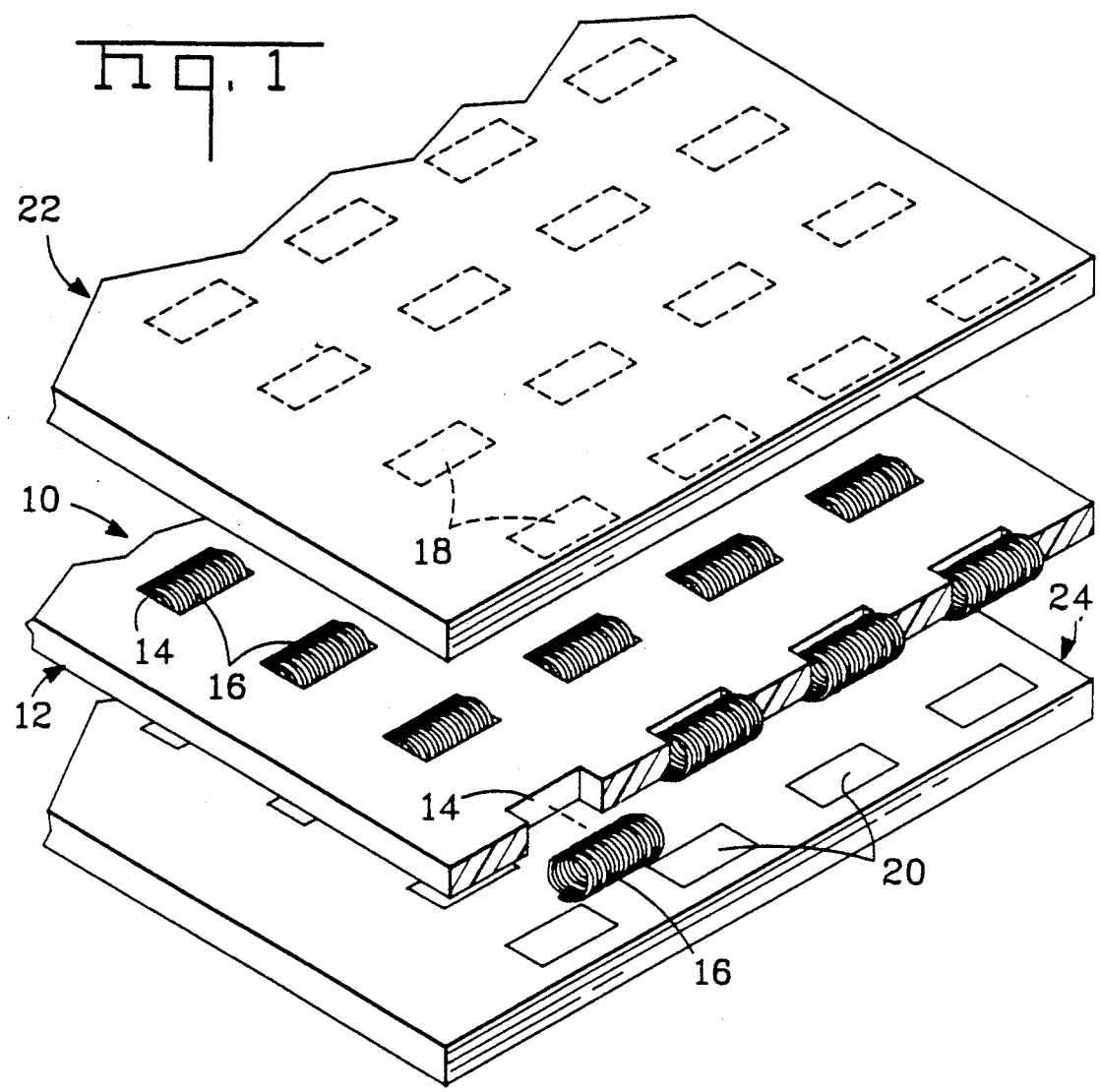
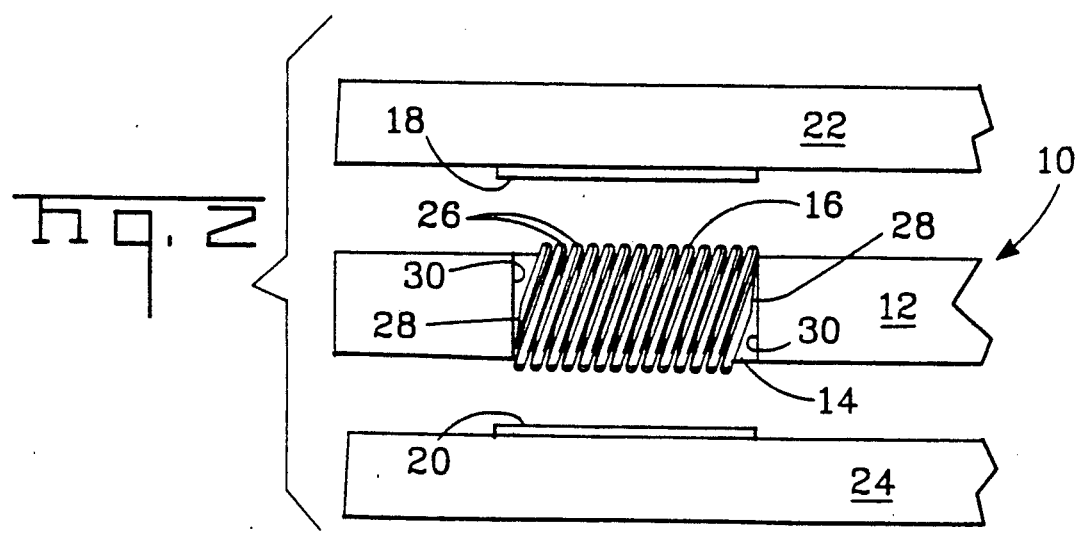

AREA ARRAY CONNECTOR FOR SUBSTRATES

FIELD OF THE INVENTION

This invention relates to stacking connectors for electrically interconnecting substrates wherein the connector is positioned between the substrates.

BACKGROUND OF THE INVENTION

Electrical connectors for electrically interconnecting two substrates have been known as least as early as July, 1970 as exemplified in U.S. Pat. No. 3,638,163 to Loosme. Patentee Loosme disclosed therein a cylindrical, non-conductive body having a plurality of spaced apart conductive contacts wrapped therearound for being placed between parallel substrates having conductive strips thereon. The strips then were electrically interconnected through the contacts Subsequent to Loosme, Y. Kotaka disclosed in U.S. Pat. No. 3,795,884 a connector comprising an insulating block having coil springs encapsulated therein. Each coil, electrically isolated from adjacent coils by an axial cut in one surface of the block, extended outwardly from diametric surfaces of the block to engage conductors on parallel printed circuit boards.

Thereafter, on Oct. 12, 1976, W. R. Evans issued U.S. Pat. No. 3,985,413 disclosing a connector comprising a generally cylindrical elastomeric body having a thin non-yielding flexible circuit wrapped therearound. Upon placing the connector between two parallel substrates and being compressed, corresponding conductors on the substrates will be electrically connected by the conductors on the flexible circuit In 1987, a P. J. Balsells issued U.S. Pat. No. 4,655,462 disclosing a coil spring with each coil being disposed at a preselected acute angle with the centerline of the spring. This type of spring, referred to as a "canted" coil spring, exerts a constant force in a loading direction normal to the centerline over a substantial range of deflection. Capitalizing on this feature, it is now proposed to use these types of springs as the electrical paths through which corresponding circuit pads on the respective substrates are connected.

SUMMARY OF THE INVENTION

According to the invention, an array connector is provided for electrically interconnecting parallel substrates. The connector in one form includes a carrier plate having spaced openings therethrough with coil spring contacts retained in the openings. The spring contacts electrically engage corresponding circuit pads on the respective parallel substrates to provide the electrical interconnection therebetween.

BRIEF DESCRIPTION OF THE DRAWINGS

FIG. 1 is a perspective view of a connector constructed in accordance with the embodiment of the present invention and parallel substrates to be electrically interconnected thereby; and FIG. 2 is a side view showing a coil spring contact in an opening in the carrier plate of the connector and corresponding circuit pads on the respective substrates to be electrically interconnected thereby.

DESCRIPTION OF THE INVENTION

With reference to the drawings connector 10 of the present invention includes carrier plate 12 having a plurality of openings 14 therethrough and canted coil spring contacts 16 positioned in openings 14.

Plate 12 may be of any suitable material but if formed from a conductive material; e.g., steel, it would have to be coated with an insulative material; e.g., a plastic such as tetrafluoroethylene sold by the Du Pont Company under its trademark "TEFLON".

Openings 14 are shown as being rectangular but could be square; i.e., the shape and size is dependent on the shape and size of circuit pads 18,20 on respective substrates 22, 24.

Canted coil spring contacts 16 are cut from length of canted coils springs such as are available from Bal Seal Engineering Co. of Santa Ana, Calif. Preferably the spring contacts are made from electrically conductive, spring-like materials such as beryllium copper and plated on the portion of individual coils 26 with gold or other noble metals.

Free ends 28 of spring contacts 16 are preferably cut to lie conformably against end walls 30 of openings 14.

Spring contacts 16 may be retained in openings 14 in any one of several ways; e.g., heat staking if plate 12 is made of a plastics material In use, connector 10 is placed between substrates 22,24 with spring contacts 16 in registration with corresponding circuit pads 18,20. The two substrates 22,24 are then secured together; e.g., by bolts (not shown) so that a compressive force is applied to the spring contacts 16. As this occurs, contacts 16 will move in the direction of the cant and by so doing, wipe the respective circuit pads 18,20.

Connector 10 is a high density connector with spring contacts 16 engaging circuit pads 18,20 on a typical center line spacing of 0.050 inches (1.27 mm). As will be appreciated by those skilled in the art, a substantial force is required to make the connection between substrates 22,24 because of the density. For this reason, canted coil spring contacts 16 are ideal for the reason that the force in the loading direction is constant over a substantial range of deflection; i.e., it does not rapidly increase as do ordinary coil springs.

Of the several advantages offered by connector 10 of the present invention, the aforementioned wiping action is very significant. We are unaware of any other high density electrical connector of the stacking type which offers this important feature. Other advantages include the redundant paths provided by the individual coils 26, the short electrical paths; i.e., each half of each coil 26 is a path and further the fact that each coil 26, because of its special relation to circuit pads 18,20, provide a canted compound curvature surface to bear against respective pads 18,20.

As will be readily apparent to those skilled in the art, modifications may be incorporated into the basic concept of the present invention. For example, coil spring contacts 16 may be formed from a pair of coil springs with one inside the other. Whereas the preferred orientation of coil spring contacts 16 are such that the major axis is generally normal relative to substrates 22, 24, one could orientate them with the minor axis normal to substrates 22,24.

Further carrier plate 12 may be made of a flexible material which will conform to undulate surface on substrates 22, 24 or which may be folded to engage nonparallel surfaces such as 3-D molded circuits.

As can be discussed from the above, an electrical connector for electrically interconnecting parallel substrates has been disclosed. The connector includes a plurality of openings containing conductive canted coil spring contacts for electrically engaging corresponding circuit pads on the respective substrates.

We claim:

1. An area array connector for electrically interconnecting circuit pads on a pair of spaced apart substrates, comprising:

a carrier plate having a plurality of openings therethrough, said openings being arranged in a pattern corresponding to the pattern of circuit pads on a pair of substrates, said plate adapted to be positioned between the substrates; and a plurality of contacts formed from canted coil springs, said contacts disposed in said openings in said plate to electrically engage corresponding circuit pads on respective substrates, said contacts being provided by individual coils of said springs and said coils provide a canted compound curvature surface to bear against the respective pads.

2. The connector of claim 1 wherein said contacts move across and wipe the corresponding circuit pads as the parallel substrates are pressed against opposite surfaces of said plate.

3. The connector of claim 1 wherein a plurality of said individual coils engage a single circuit pad.

4. The connector of claim 1 wherein said carrier plate is flexible to conform to non-parallel substrates.

5. The connector of claim 1 wherein the canted coil spring contacts are made of an electrically conductive spring-like material and plated with a noble metal.

6. The connector of claim 5 wherein the material is beryllium copper.

7. An area array connector for electrically interconnecting circuit pads on a pair of spaced apart substrates, comprising:

a carrier plate having a plurality of openings therethrough, said openings being arranged in a pattern corresponding to the pattern of circuit pads on a pair of substrates, said plate adapted to be positioned between the substrates; and a plurality of contactors formed from canted coil springs and disposed in said openings in said plate with the major axis of individual coils being generally orientated perpendicular to the spaced apart substrates.

* * * * *